United States Patent
Mishra et al.

(10) Patent No.: US 9,537,687 B2
(45) Date of Patent: Jan. 3, 2017

(54) MULTI-MODULATION FOR DATA-LINK POWER REDUCTION AND THROUGHPUT ENHANCEMENT

(71) Applicant: QUALCOMM Incorporated, San Diego, CA (US)

(72) Inventors: Lalan Jee Mishra, San Diego, CA (US); George Wiley, San Diego, CA (US); Richard Wietfeldt, San Diego, CA (US); James Panian, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/014,339

(22) Filed: Feb. 3, 2016

(65) Prior Publication Data

US 2016/0226682 A1    Aug. 4, 2016

Related U.S. Application Data

(60) Provisional application No. 62/112,084, filed on Feb. 4, 2015.

(51) Int. Cl.
| | |
|---|---|
| *H04L 7/08* | (2006.01) |
| *H04L 25/49* | (2006.01) |
| *H04L 27/20* | (2006.01) |
| *H03M 5/08* | (2006.01) |
| *H03M 5/12* | (2006.01) |

(52) U.S. Cl.
CPC ............ *H04L 25/4902* (2013.01); *H03M 5/08* (2013.01); *H03M 5/12* (2013.01); *H04L 7/08* (2013.01); *H04L 27/2092* (2013.01)

(58) Field of Classification Search
CPC .... H04L 25/4902; H04L 27/2092; H04L 7/08; H03K 7/05; H03K 9/08; H03M 1/504; H03M 1/822; H03M 1/00; H03M 5/08; H03M 5/12; H04B 14/04
USPC ........ 375/238, 242, 257, 259; 333/109, 124, 333/238, 246
See application file for complete search history.

(56) References Cited

U.S. PATENT DOCUMENTS

| | | | |
|---|---|---|---|
| 6,697,420 B1 | 2/2004 | Simon et al. | |
| 8,284,830 B2* | 10/2012 | Lee ........................... | H03K 7/08 318/599 |
| 2001/0006538 A1* | 7/2001 | Simon ................. | G06F 13/4086 375/259 |
| 2002/0120880 A1* | 8/2002 | Simon .................... | H04L 7/0008 713/400 |
| 2004/0101060 A1* | 5/2004 | Simon ................... | H04L 25/085 375/242 |
| 2006/0093029 A1* | 5/2006 | Becker ................ | H04L 25/4902 375/239 |
| 2011/0316731 A1* | 12/2011 | Scheytt .................... | H03K 7/08 341/143 |
| 2013/0121397 A1 | 5/2013 | Eliezer | |

(Continued)

FOREIGN PATENT DOCUMENTS

WO    WO-0225842 A2    3/2002

OTHER PUBLICATIONS

International Search Report and Written Opinion—PCT/US2016/016433 ISA/EPO—May 2, 2016.

*Primary Examiner* — Siu Lee
(74) *Attorney, Agent, or Firm* — Haynes and Boone, LLP

(57) ABSTRACT

A multi-modulation scheme is provided that combines pulse-width modulation and phase modulation.

20 Claims, 8 Drawing Sheets

(56) References Cited

U.S. PATENT DOCUMENTS

2013/0230094 A1* 9/2013 Eliezer .................. H04H 40/27
　　　　　　　　　　　　　　　　　　　　　375/238
2016/0142230 A1* 5/2016 Eliezer ................ H04L 25/4902
　　　　　　　　　　　　　　　　　　　　　375/238

* cited by examiner

MULTI-MODULATION FOR DATA-LINK POWER REDUCTION AND THROUGHPUT ENHANCEMENT

CROSS-REFERENCE TO RELATED APPLICATIONS

This application claims the benefit of U.S. Provisional Application No. 62/112,084, filed Feb. 4, 2015.

TECHNICAL FIELD

This application relates to signaling, and more particularly to a multi-modulation digital signaling scheme combining pulse width modulation and phase modulation.

BACKGROUND

A number of digital signaling protocols have been developed to support communication between integrated circuits in a system such as a mobile device. These signaling protocols are deemed herein as "digital" in that the transmitting circuit either drives its transmit pin high to a power supply voltage level or grounds the pin to transmit a bit. Examples of such digital signaling protocols include general purpose I/O (GPIO) and universal asynchronous receiver transmitter (UART). For example, a UART transmitter drives a digital signal over a transmit pin that is received on a receive pin at a UART receiver. The UART receiver samples the received signal using an oversampling clock to determine whether the received signal was binary high or binary low.

To reduce power consumption, various lossless data compression techniques have been utilized such as run length encoding (RLE). But run length encoding does not guarantee a fixed and predictable throughput enhancement as the degree of compression depends upon the randomness of the data. If the data transmission is completely random, run length encoding offers no benefit. Other more complex schemes offer improved throughput but are not compatible with digital signaling. For example, the use of a quadrature phase shift key (QPSK) scheme has twice the throughput of conventional digital signaling but requires the use of two independent sinusoidal sub-carriers. In contrast, a digital signal protocol is much simpler as the transmitter needs to merely drive its transmit pin to a power supply voltage and/or to ground during a symbol transmission. Similarly, a digital signaling receiver needs to merely determine whether a voltage high or low signal is being received at each sampling of an oversampling clock.

Accordingly, there is a need in the art for an improved digital signaling protocol with increased throughput and reduced power consumption.

SUMMARY

To enhance throughput over traditional digital signaling techniques, a transmitter is provided that transmits phase-encoded pulse-width-modulated symbols. For example, suppose that the symbols have two possible pulse widths. In a conventional pulse-width modulation scheme, these two pulse widths would represent one bit. But in addition, the symbols also have at least two possible phases. In a two-phase embodiment, the pulses are aligned to either have their falling edges aligned with the end of the bit period (symbol period) or to have their rising edges aligned with the beginning of the bit period. The two phase alignments thus represent another bit. Given this combination of both pulse-width modulation and phase modulation, the resulting symbols are denoted herein as "multi-modulation" symbols or words. The transmission of multi-modulation symbols is quite advantageous as compared to binary phase or pulse-width modulation schemes due to the increased throughput and reduced power consumption. Moreover these advantages are obtained without departing from traditional digital signaling techniques. In other words, a transmitter need merely drive a transmit pin to a power supply voltage and to ground during the transmission of the resulting multi-modulation symbols. The complications involved with analog sinusoids such as in QPSK are thus avoided. These advantages may be better appreciated through the following detailed description.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

A digital signaling protocol is provided that doubles the throughput over the traditional digital signaling used in, for example, the UART protocol. In that regard, a UART bit is typically represented by a voltage signal that is either at the power supply level or ground across the bit period. This is quite advantageous in terms of simplicity as a conventional inverter may be used as the output driver. The digital signaling protocol disclosed herein preserves this simplicity in that the transmitted multi-modulation symbols include a binary high portion that is pulse-width-modulated to have at least a first pulse width and a second pulse width. The corresponding transmitter asserts its transmit pin to a power supply voltage to transmit the binary high portion of each multi-modulation symbol. The transmitter grounds its transmit pin to transmit a remaining binary-low portion of each multi-modulation symbol. To enhance throughput over traditional digital signaling techniques, the transmitter also selects between two edge alignments for the binary high portion of each multi-modulation symbol. These two edge alignment are defined with regard to a period or symbol length for each multi-modulation symbol. In a first edge alignment, a rising edge of the binary-high portion is aligned with a beginning of the symbol period. In a second edge alignment, a falling edge of the binary-high portion is aligned with an end of the symbol period.

Figure 1:
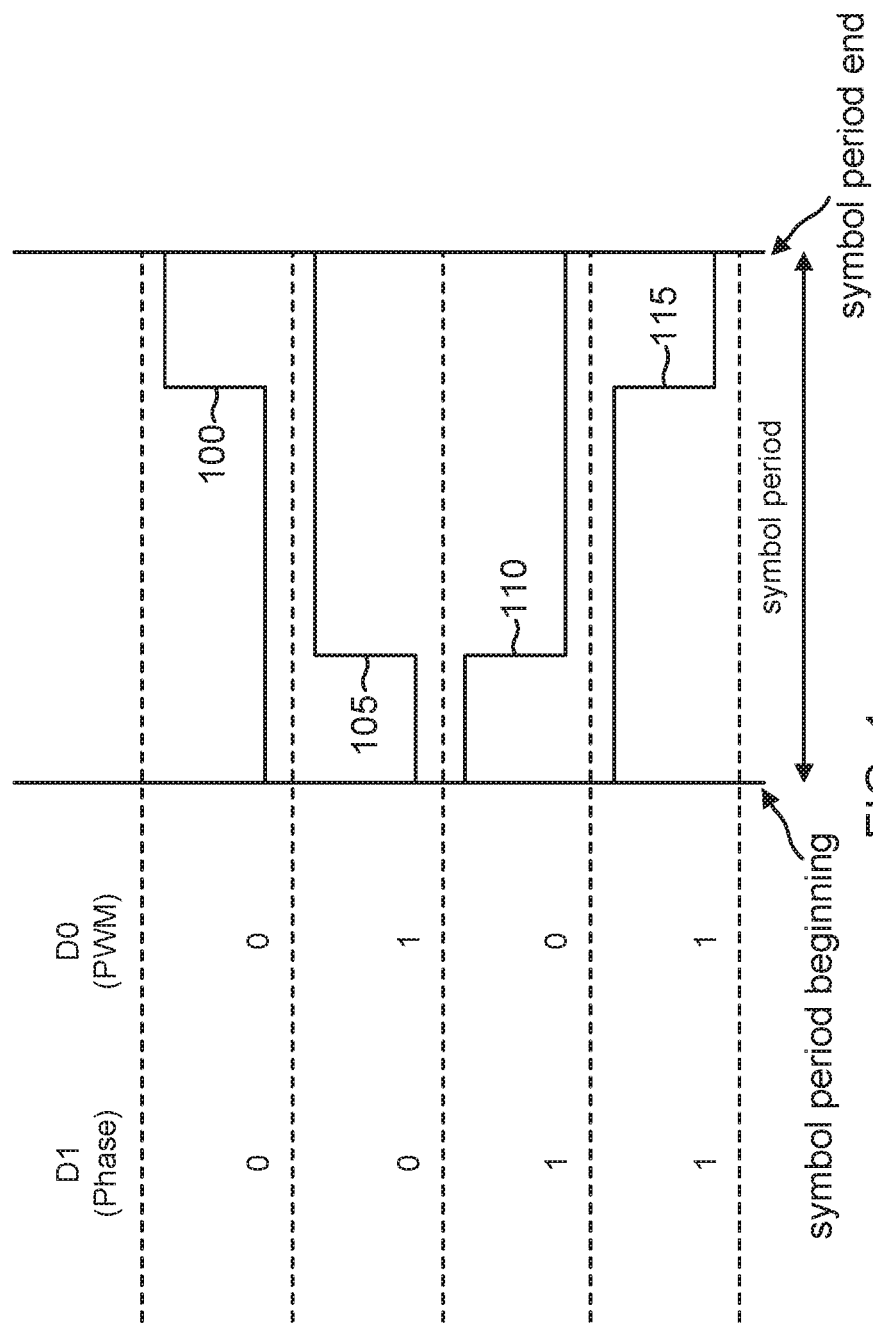
FIG. 1 illustrates four example multi-modulation two-bit symbols.

The following example embodiment is directed to a system using just two pulse widths and two phases but it will be appreciated that any number of pulse widths and phases may be combined as disclosed herein. Two example pulse widths for the binary-high portion are shown in FIG. 1. The binary-high portion is denoted as the "pulse" in the following discussion. A first pulse 100 is 25% of the symbol period whereas a second pulse 105 is 75% of the symbol period. Note that both pulses 100 and 105 having their falling edges aligned with the end of the symbol period. Pulses 100 and 105 are thus an example of the second edge alignment discussed above in which the pulse falling edge is aligned with the end of the symbol period. In a logic high system, both pulses 100 and 105 thus start with a logic zero (ground) and end logic high (the power supply voltage). In a logic low system, it is equivalent to indicate that pulses 100 and 105 both start with a logic high value (ground) and end with a logic low value (the power supply voltage). The following discussion is directed to a logic high system without loss of generality. Since both pulses 100 and 105 are phased so as to end simultaneously with the bit period (symbol period) boundary, pulses 100 and 105 may be deemed to represent a first phase. A complementary second phase is represented by a pair of pulses 110 and 115. Pulse 110 is analogous to pulse 100 in that it also has a pulse width equaling 25% of the symbol period. But unlike pulse 100, pulse 110 is in phase such that it begins simultaneously with the symbol period beginning. The rising edge for pulse 110 is thus aligned with the beginning of the symbol period. Similarly, pulse 115 is shifted 180 degrees with respect to pulse 105 such that the rising edge of pulse 115 is aligned with the beginning or start of the symbol period. In contrast to pulse 110, pulse 115 has a width of 75% of the symbol period. Pulses 110 and 115 are an example of the first edge alignment discussed above in which the pulse rising edge aligns with the beginning of the symbol period.

There is thus a binary phase modulation represented by pulses 110 and 115 as compared to pulses 100 and 105. The first edge alignment or second edge alignment defines this binary phase modulation. Similarly, each pair of pulses 100/105 and 110/115 represents a binary pulse width modulation. The combination of pulses 100, 105, 110, and 115 thus represent both a binary phase modulation and a binary pulse width modulation such that each pulse may be deemed to comprise a two-bit multi-modulation symbol. Pulses 100, 105, 110, and 115 may thus also be denoted as multi-modulation symbols 100, 105, 110, and 115, respectively. Unlike alternative coding techniques such as QPSK, the modulation for pulses 100, 105, 110, and 115 is entirely binary: a transmitter need only transmit a binary high signal for some duration of the bit period and a binary low signal for the remaining duration of the bit period. Since each pulse represents a two-bit word, there are four possible binary two-bit words that may be represented as: [00], [01], [10], and [11]. It is arbitrary what two-bit word is assigned to a given pulse. There would be four such choices—FIG. 1 represents one choice in which pulse 100 represents the word [00], pulse 105 represents the word [01], pulse 110 represents the word [10], and pulse 115 represents the word [11]. It will be appreciated that alternative pulse widths such as 70/30 or 80/20 may be used for the binary pulse width modulation scheme. In addition, the number of pulse widths and phases may be increased from just two in alternative embodiments.

Figure 2:
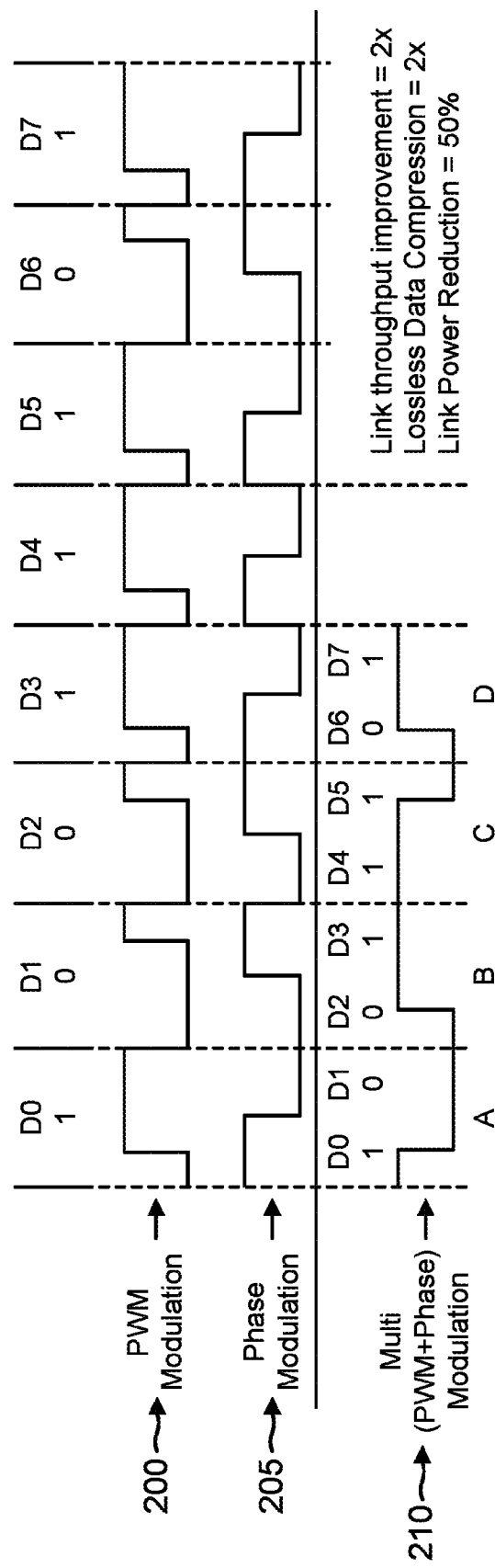
FIG. 2 illustrates the relationship between some of the multi-modulation symbols of FIG. 1 and a corresponding set of binary-phase-modulated input bits and pulse-width-modulated input bits.

The throughput enhancement and power reduction from the resulting "multi-mode" modulation that combines a binary phase modulation with a binary pulse width modulation may be better appreciated with reference to FIG. 2. As shown in FIG. 2, there are eight binary bits D0 through D7 that are represented using pulse-width modulation to produce a conventional pulse-width-modulated sequence 200. These same bits may also be represented using phase modulation to produce a conventional phase-modulated sequence 205. The carrier for the phase modulation is a square pulse (a pulse width of 50% of the bit period) that has its falling edge aligned with the end of the bit period to represent a binary zero. Such an alignment will be referred to herein as "not flipped" in that it represents 0 degrees of phase modulation for the square pulse. Conversely, a phase modulation of a binary 1 is represented by a square pulse having its rising edge aligned with the beginning of the bit period. Such a modulation is denoted herein as "flipped" in that it represents 180 degrees of phase modulation.

For either conventional digital sequence 200 and 205, it requires eight bit periods to transmit the eight bits D0 through D7. In contrast, a multi-modulation sequence 210 transmits these eight bits in just four bit periods, which represents a two times greater throughput than the single-modulation sequences 200 and 205. To create multi-modulation sequence 210, half of the bits D0 through D7 are designated as pulse-width modulation bits and half are designated as phase modulation bits. For example, bits D0, D2, D4, and D6 may be assumed to represent the phase modulation bits. Conversely, bits D1, D3, D5, and D7 may be assumed to represent the pulse-width modulation bits. In this example, a binary 1 is represented by a pulse of 75% of the bit period whereas a binary 0 is represented by a pulse of 25% of the bit period. These pulses all have their falling edges aligned with the end of their respective bit periods as shown in sequence 200.

Each phase modulation bit D0, D2, D3, and D6 phase modulates the subsequent pulse-width modulation bit (bits D1, D3, D5, and D7, respectively). In this case, a binary one for these phase modulation bits is assumed to represent a 180 degree phase reversal such that the pulse modulation is "flipped." Conversely, a binary zero for these phase modulation bits is assumed to represent no phase change ("not flipped"). PWM bit D1 is a zero, which corresponds to a 25% pulse width in this example. Since the phase modulation bit D0 has a binary one value, the pulse for PWM bit D1 is flipped to form a corresponding multi-modulation word A (which corresponds to multi-modulation symbol 110 discussed with regard to FIG. 1). PWM bit D3 is a binary one, which corresponds to a 75% pulse width in this example. Conversely, the phase bit D2 has a binary zero value so that the pulse from PWM bit D3 is not flipped to form a corresponding multi-modulation word B (which corresponds to multi-modulation symbol 105 of FIG. 1). However, the phase modulation bit D4 has a binary one value so the pulse for PWM bit D5 is flipped to form a corresponding multi-modulation word C (which corresponds to multi-modulation symbol 115 of FIG. 1). Finally, the phase bit D6 is a binary zero so the pulse from PWM bit D7 is not flipped to form a corresponding multi-modulation word D (which again corresponds to multi-modulation symbol 105 of FIG. 1). One can immediately see several advantages of the resulting multi-modulation words as compared to the input PMW and phase modulation bits. For example, the throughput is increased by two if one assumes that the multi-modulation symbol period is the same as the bit period for the phase and PWM bits. In addition, since there is just the transmission of four pulses in the multi-modulation words in sequence 210 as compared to the use of eight pulses in sequence 200 or sequence 205 so that power consumption is decreased by one half Finally, the electromagnetic interference (EMI) from multi-modulation words A through D is reduced as compared to conventional sequences 200 or 205 since the number of rising and falling edges is reduced by one half.

Figure 3A:
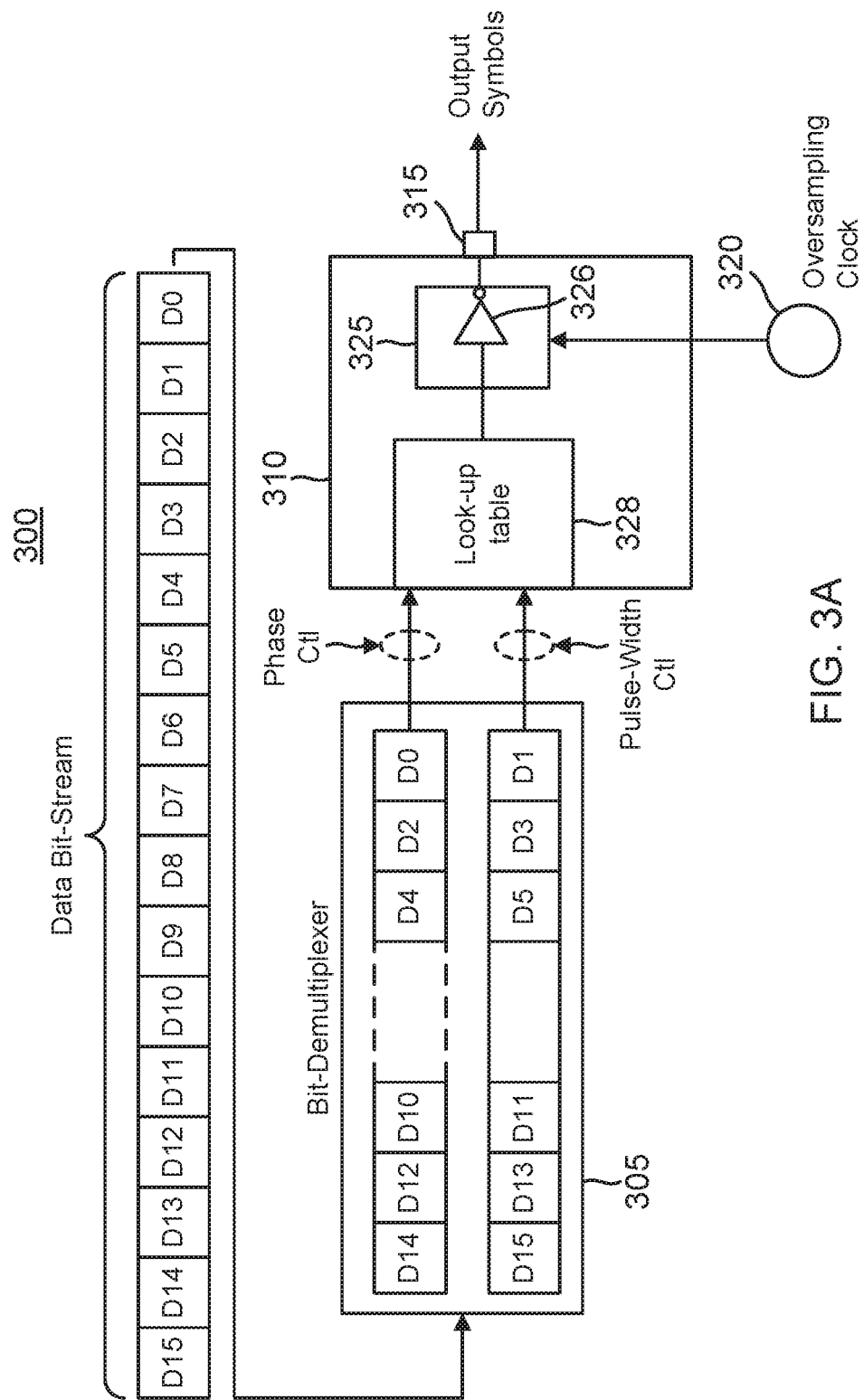
FIG. 3A is a block diagram for a transmitter in accordance with an embodiment of the disclosure.

An example transmitter 300 configured for the transmission of multi-modulation symbols will now be discussed as shown in FIG. 3A. A bit demultiplexer 305 receives an input data stream and de-multiplexes the input bit stream into PWM input bits and phase input bits. For example, if the input bit stream comprises sixteen bits ranging from a bit D0 to a bit D15, demultiplexer 305 may de-mux bits D0, D2, D4, D6, D8, D10, D12, and D14 to form the phase bits. Conversely bits D1, D3, D5, D7, D9, D11, D13, and D15 form the PWM bits. In this embodiment, each phase bit and the consecutive PWM bit form an input bit pair that is modulated by as modulator 310 into one of the four possible multi-modulation symbols 100, 105, 110, and 115 of FIG. 1. For example, bits D0 and D1 form one input bit pair, bits D2 and D3 form another, and so on. Modulator 310 may comprise a four-bit look-up table 328 that stores the four possible input combinations [00], [01], [10], and [11]. The look-up table selects for multi-modulation symbol 100 when an input bit pair [00] is received. Similarly, the look-up table selects for multi-modulation symbol 105 when an input bit pair [01] is received and so on. An output driver 325 transmits the multi-modulation symbol selected by lookup table 328 responsive to samples generated according to cycles of a clock signal (e.g., clock edges) from an oversampling clock source 320. Output driver 325 may include an inverter 326 that drives the resulting samples out through a transmit pin 315 to provide the resulting transmitted multi-modulation symbol to an external receiver (discussed further below). As used herein, "pin" is a generic term to cover the structure such as a pad or an actual pin that an integrated circuit uses to couple to leads on circuit board or other physical interconnect (e.g., package interconnect or through-hole via interconnect). To provide additional increases in throughput, the input data stream may by losslessly encoded such as by being run length encoded prior to the bit-demuxing.

Figure 3B:
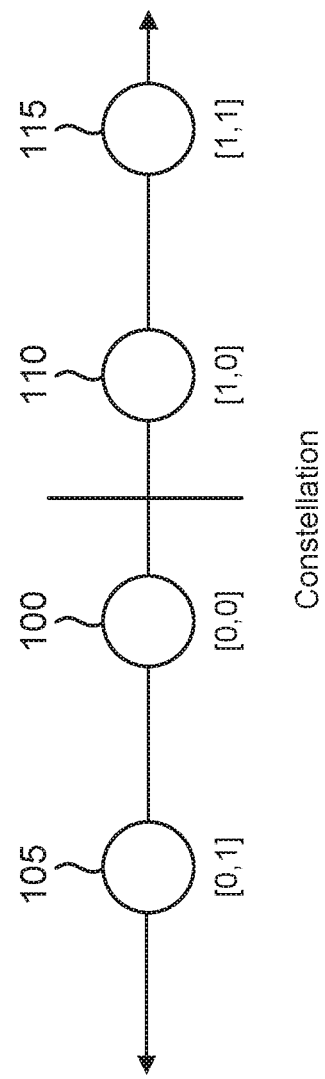
FIG. 3B is a conceptual diagram illustrating the constellation for the multi-modulation symbols transmitted by the transmitter of FIG. 3A.

FIG. 3B illustrates the resulting phase constellation for the four multi-modulation symbols 100 through 115. All the symbols lie on the x-axis. Since multi-modulation symbols 100 and 105 have their trailing edges aligned with the end of the bit boundary, they are deemed arbitrarily to have negative phase whereas multi-modulation symbols 110 and 115 are deemed to have positive phase. Because the pulse widths of multi-modulation symbol 105 and 115 are longer than that of multi-modulation symbols 100 and 110, multi-modulation symbols 105 and 115 are displaced more from the origin to represent their greater energy.

Figure 3C:
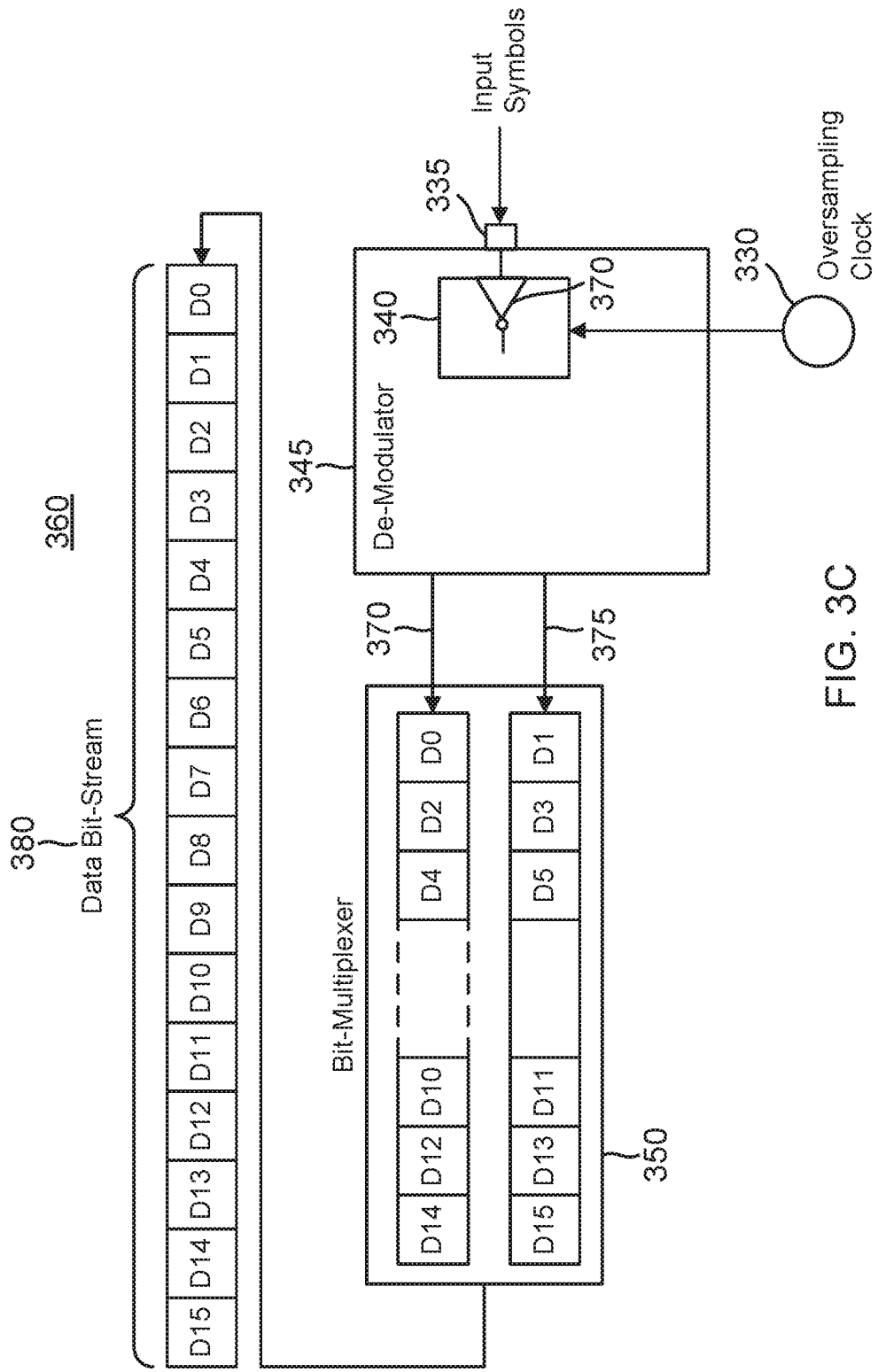
FIG. 3C is a block diagram of a receiver in accordance with an embodiment of the disclosure.

Transmit pin 315 of transmitter 300 couples through a suitable transmission channel such as a lead on a printed circuit board to a receive pin 335 of a receiver 360 as shown in FIG. 3C. Receiver 360 includes a demodulator 345 for demodulating the received symbols on receive pin 335. For example, demodulator 345 may include an input circuit 340 that includes an inverter 370 for producing samples of the received symbol responsive to cycles of a clock signal (e.g., clock edges) of an oversampling clock 330. A received symbol is thus represented by a series of samples in demodulator 345. Demodulator 345 may analyze the beginning sample (or samples) in the series to determine whether the beginning sample is greater than a threshold value (e.g., the power supply voltage used by transmitter 300 divided by two). Should the beginning sample be greater than the threshold value, demodulator 345 determines that the received multi-modulation symbol has a rising edge alignment with the beginning of the symbol period and produces a corresponding phase modulation bit (e.g., a corresponding bit 375) that is received by a bit multiplexer 350. Similarly, demodulator 345 may count the number of samples in the received series of samples that exceed the voltage threshold to determine which pulse width corresponds to the received multi-modulation symbol. Based upon the determined pulse width, demodulator 345 produces a corresponding phase modulation bit (e.g, a corresponding bit 375) that is also received by bit multiplexer 350. Bit multiplexer 350 then multiplexes the resulting bit series to produce a received data bit stream 380. Periodically, transmitter 300 may transmit a training series of samples responsive to cycles of its oversampling clock so that receiver 360 may periodically align its oversampling clock 330 to oversampling clock 320 of transmitter 300.

Figure 4:
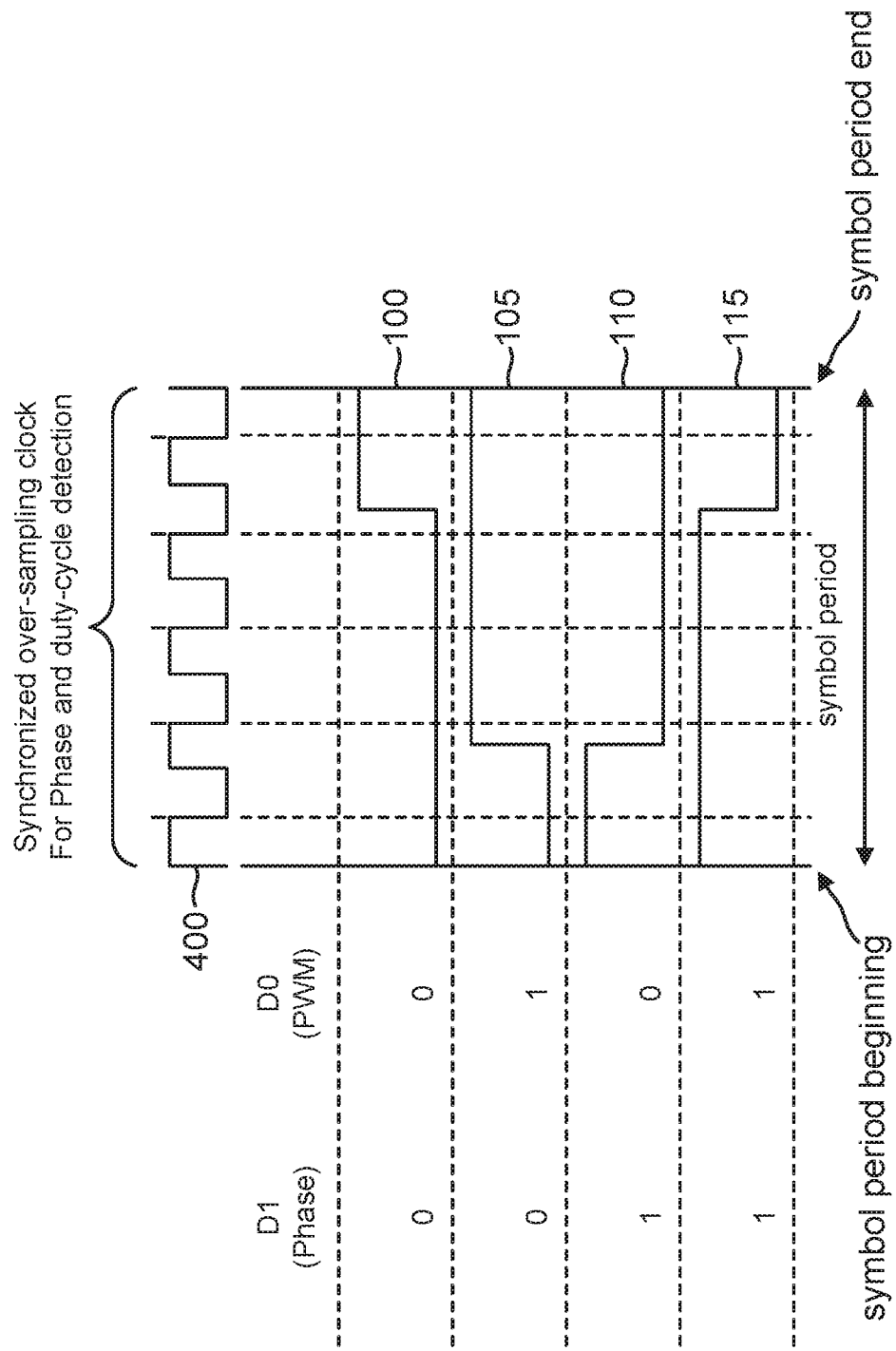
FIG. 4 illustrates the oversampling clock samples for demodulating the multi-modulated symbols transmitted from the transmitter of FIG. 3.

The demodulation of multi-modulation symbols 100 through 115 in a receiver 360 as be performed with regard to samples of an oversampling clock signal 400 is shown in FIG. 4. To keep the oversampling clocks 330 and 320 in phase with each other; transmitter 300 may periodically transmit a training sequence that such as a series of pulses having a 50% duty cycle. The multi-modulation symbols may then be transmitted using frames and headers such as is conventionally performed in UART. The frame and header dimensions are known to both the receiver and transmitter. Thus, the receiver may determine the symbol boundaries for the frames with regard to this known structure. As shown in FIG. 4, receiver 360 of FIG. 3 may use the initial sample as sampled according to oversampling clock signal 400 of each multi-modulation symbol 100 through 115 to determine its phase. If that first sample is zero, then receiver 360 knows that it will be demodulating either multi-modulation symbol 100 or 105. To distinguish between these multi-modulation symbols, receiver 360 may count the number of samples across the multi-modulation symbol that are binary one (the power supply voltage) as compared to a count of samples that are binary zero to determine the symbol's pulse width by comparing each sample to a threshold such as one-half of the power supply voltage. Conversely, if the initial sample is a binary one, receiver 360 must then distinguish between multi-modulation symbols 110 and 115. This distinction may also be performed by comparing a count of binary one samples from the sampling of the received multi-modulation symbol to a count of binary zero samples from this same sampling. Such an oversampling scheme may be readily extended to demodulate higher order (greater than binary) phase and pulse-width modulations. In addition, the multi-modulation symbol may also employ multiple amplitudes to allow yet a greater reduction of power consumption and increase in throughput.

Figure 5:
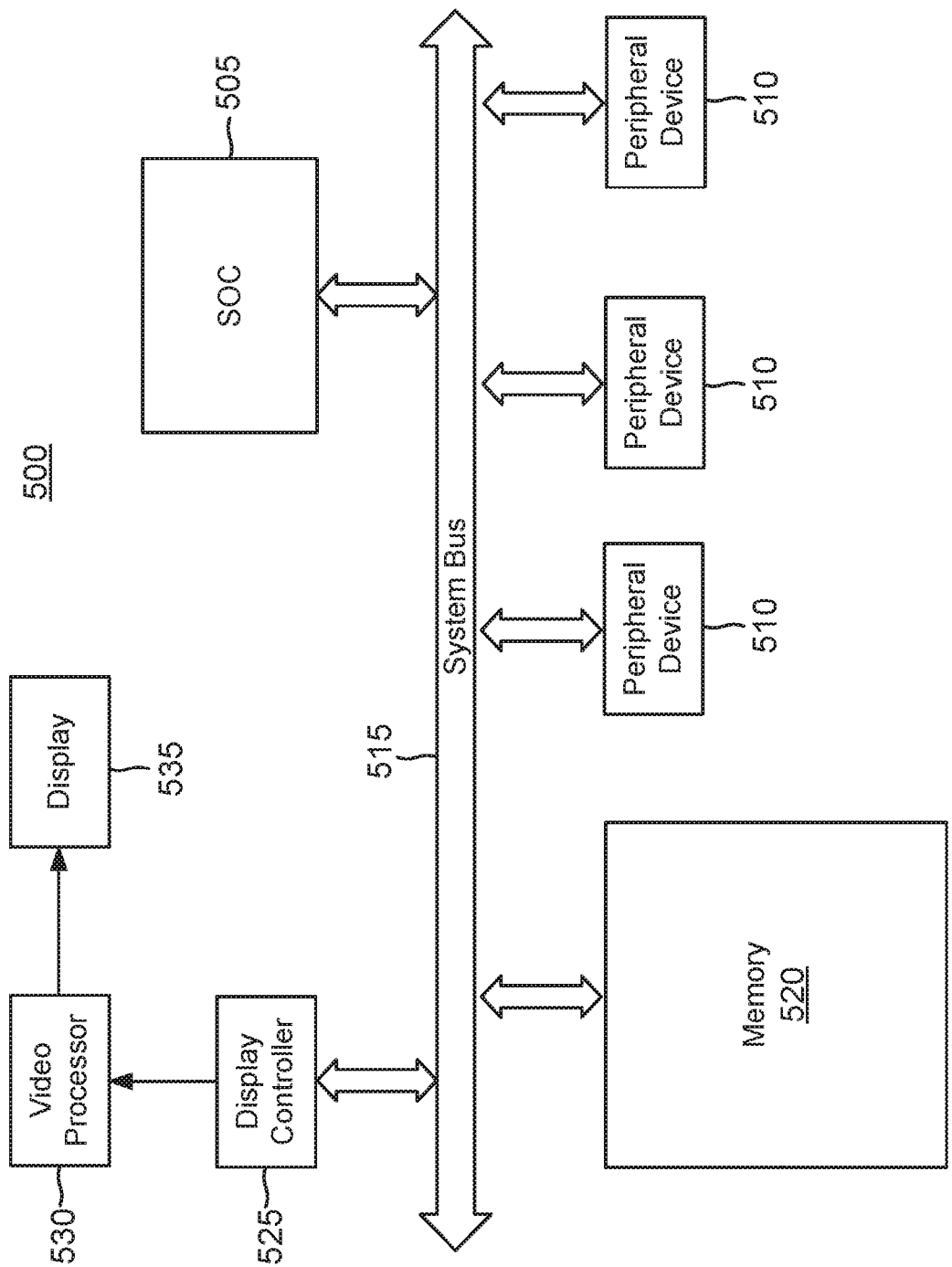
FIG. 5 is an example system incorporating the transmitter of FIG. 3A and the receiver of FIG. 3C.

An example system 500 is shown in FIG. 5 in which a system-on-a-chip (SOC) 505 is configured with an transmitter (not illustrated) such as transmitter 300 and a receiver (not illustrated) such as receiver 360 to communicate with multi-modulation symbols with a plurality of peripheral devices 510. Each peripheral device 510 thus also includes a corresponding receiver and transmitter. The resulting multi-modulation symbols may be transmitted over a system bus 515. System 500 may comprise a cellular phone, smart phone, personal digital assistant, tablet computer, laptop computer, digital camera, handheld gaming device, or other suitable device. In addition to communicating with peripheral devices 510, SOC 505 also communicates through system bus 515 with a memory such as a DRAM 520 and a display controller 525. Display controller 525 in turn couples to a video processor 530 that drives a display 535.

Figure 6:
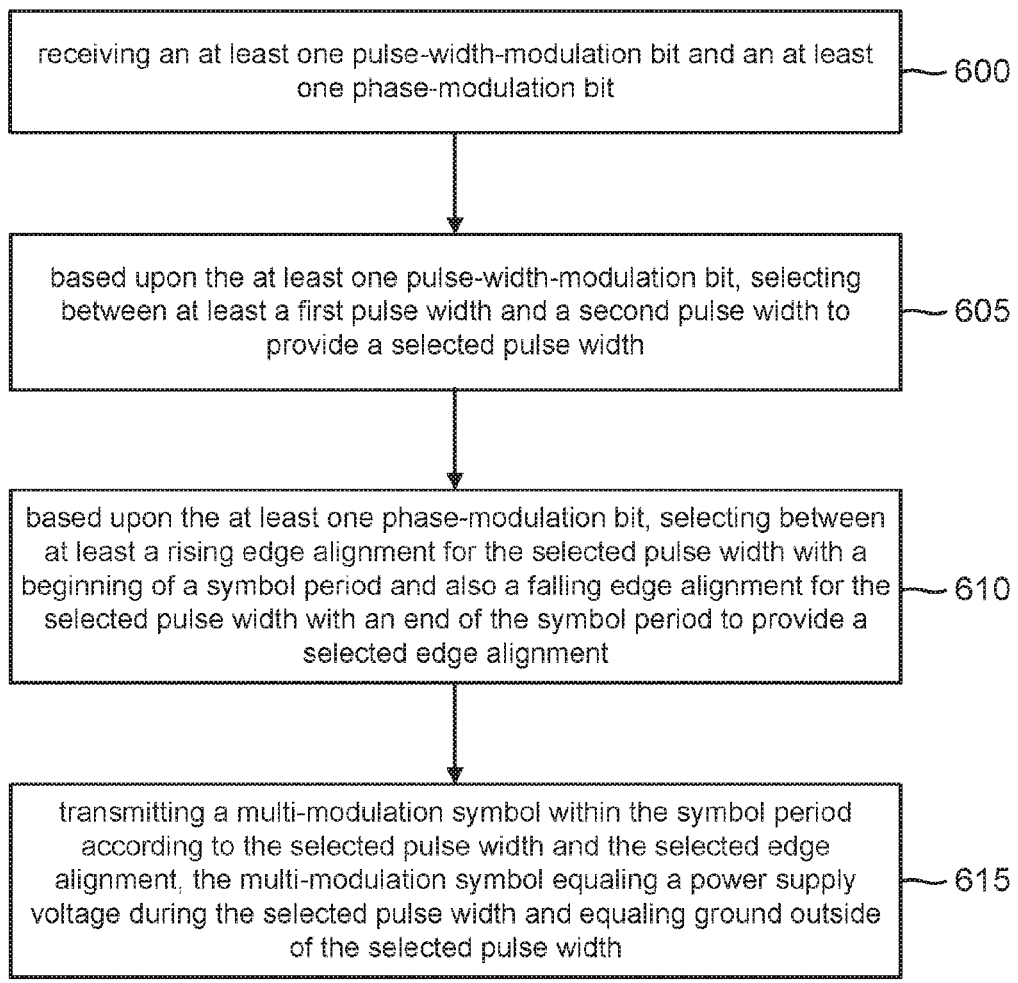
FIG. 6 is a flowchart of a method of transmitting multi-modulation symbols in accordance with an embodiment of the disclosure.

An example method of operation for transmitter 300 will now be discussed with regard to the flowchart of FIG. 6. The method includes an act 600 of receiving at least one pulse-width-modulation bit and at least one phase-modulation bit. The receipt of the data bit stream at bit demultiplexer 305 and the resulting demultiplexing of the phase-modulation bit and the pulse-width-modulation bit to modulator 310 in transmitter 300 is an example of act 600. The method also includes an act 605 that is based upon the at least one pulse-width-modulation bit and includes selecting between at least a first pulse width and a second pulse width to provide a selected pulse width. Similarly, the method includes an act 610 that is based upon the at least one phase-modulation bit and includes selecting between at least a rising edge alignment for the selected pulse width with a beginning of a symbol period and also a falling edge alignment for the selected pulse width with an end of the symbol period to provide a selected edge alignment. The selection of the appropriate symbol by look-up table 328 is an example of acts 605 and 610. Finally, the method includes an act 615 of transmitting a symbol within the symbol period according to the selected pulse width and the selected edge alignment, the symbol equaling a power supply voltage during the selected pulse width and equaling ground outside of the selected pulse width. The transmission of a symbol by output driver 325 is an example of act 615.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A method, comprising:
   receiving an at least one pulse-width-modulation bit and an at least one phase-modulation bit;
   based upon the at least one pulse-width-modulation bit, selecting between at least a first pulse width and a second pulse width to provide a selected pulse width;
   based upon the at least one phase-modulation bit, selecting between at least a rising edge alignment for the selected pulse width with a beginning of a symbol period and also a falling edge alignment for the selected pulse width with an end of the symbol period to provide a selected edge alignment; and
   transmitting a multi-modulation symbol within the symbol period according to the selected pulse width and the selected edge alignment, the multi-modulation symbol equaling a power supply voltage during the selected pulse width and equaling ground outside of the selected pulse width.

2. The method of claim 1, wherein the first pulse width comprises a first portion of the symbol period and the second pulse width comprises a remaining second portion of the symbol period.

3. The method of claim 2, wherein the first pulse width is 25% of the symbol period and the second pulse width is 75% of the symbol period.

4. The method of claim 1, wherein transmitting the multi-modulation symbol comprises transmitting samples of the symbol responsive to cycles of a first oversampling clock signal.

5. The method of claim 4, further comprising:
   in a receiver, sampling the multi-modulation symbol across the symbol period according to a second oversampling clock to provide a series of samples; and
   using a first one of the samples in the series of samples to determine whether the selected edge alignment is the rising edge alignment or the falling edge alignment.

6. The method of claim 4, further comprising:
   for the series of samples, counting the samples that equal the power supply voltage to provide a first count and counting the samples that equal ground to provide a second count; and
   comparing the first count and the second count to determine whether the selected pulse width is the first pulse width or the second pulse width.

7. The method of claim 4, wherein transmitting the multi-modulation symbol comprises transmitting the multi-modulation symbol over a transmit pin.

8. The method of claim 7, further comprising periodically transmitting a training sequence over the transmit pin responsive to cycles of the first oversampling clock signal.

9. The method of claim 8, further comprising periodically aligning a second oversampling clock signal in a receiver responsive to receiving each training sequence.

10. The method of claim 1, wherein transmitting the multi-modulation symbol further comprises run length encoding the multi-modulation symbol with at least one other multi-modulation symbol.

11. A transmitter, comprising:
    a bit demultiplexer for demultiplexing an input data bit stream into a series of phase-width-modulation bits and a series of phase-modulation bits, wherein each phase-modulation bit is paired with a corresponding one of the phase-width-modulation bits to form a series of bit pairs;
    a modulator configured to receive each bit pair and to select between at least a first pulse width and a second pulse width to provide a selected pulse width for a multi-modulation symbol based upon a binary value for the phase-width-modulation bit in the bit pair and configured to select between at least a rising edge alignment for the selected pulse width with a beginning of a symbol period and a falling edge alignment for selected pulse width with an end of the symbol period to provide a selected edge alignment for the multi-modulation symbol responsive to a binary value for the corresponding phase-modulation bit;
    a transmit pin; and
    an output driver configured to drive the multi-modulation symbol through the transmit pin within the symbol period, wherein the output driver is configured to charge the transmit pin during the selected pulse width and to discharge the transmit pin to ground outside of the selected pulse width.

12. The transmitter of claim 11, wherein the modulator includes a lookup table configured to look up, for each bit pair, the selected pulse width responsive to the binary value of the bit pair's pulse-width-modulation-bit and to look up the selected edge alignment responsive to the binary value of the bit pair's phase-modulation bit.

13. The transmitter of claim 11, wherein the output driver comprises an inverter.

14. The transmitter of claim 13, wherein the output driver is further configured to drive the multi-modulation symbol through the transmit pin responsive to samples of an oversampling clock.

15. The transmitter of claim 14, wherein the output driver is further configured to periodically transmit a training series responsive to samples of the oversampling clock.

16. A receiver, comprising:
a receive pin;
a demodulator configured to demodulate a received multi-modulation symbol received on the receive pin during a symbol period to determine a pulse-width-modulation bit for the received multi-modulation symbol responsive to whether a pulse in the received multi-modulation symbol has a first pulse width or has a second pulse width and configured to determine a phase-modulation bit for the received multi-modulation symbol responsive to whether the pulse has a rising edge alignment with a beginning of the symbol period or a falling edge alignment with an end of the symbol period; and
a bit multiplexer configured to multiplex the pulse-width-modulation bit and the phase-modulation bit into an input data stream.

17. The receiver of claim 16, further comprising:
an oversampling clock source configured to provide an oversampling clock signal, wherein the demodulator is configured to sample the received multi-modulation symbol responsive to cycles of the oversampling clock signal to produce a series of samples.

18. The receiver of claim 17, wherein the demodulator is further configured to compare at least a first one of the samples to a threshold to determine the phase-modulation bit.

19. The receiver of claim 17, wherein the demodulator is further configured to compare each sample in the series to a threshold to count which of the samples exceeds the threshold, and wherein the demodulator is further configured to determine the pulse-width-modulation bit responsive to the count.

20. The receiver of claim 17, wherein the receiver is further configured to align the oversampling clock signal responsive to a received training series.

* * * * *